(12) United States Patent
Lee et al.

(10) Patent No.: US 10,580,500 B2
(45) Date of Patent: Mar. 3, 2020

(54) SEMICONDUCTOR MEMORY DEVICE AND OPERATING METHOD THEREOF

(71) Applicant: SK hynix Inc., Gyeonggi-do (KR)

(72) Inventors: Dong Uk Lee, Chungcheongbuk-do (KR); Jae Hyuk Bang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/987,488

(22) Filed: May 23, 2018

(65) Prior Publication Data

US 2019/0115083 A1  Apr. 18, 2019

(30) Foreign Application Priority Data

Oct. 18, 2017 (KR) .................. 10-2017-0135208

(51) Int. Cl.
| | |
|---|---|
| *G11C 16/04* | (2006.01) |
| *G11C 16/26* | (2006.01) |
| *G11C 16/34* | (2006.01) |
| *G11C 11/56* | (2006.01) |
| *G11C 29/02* | (2006.01) |
| *G11C 16/10* | (2006.01) |
| *G11C 16/14* | (2006.01) |
| *G11C 29/42* | (2006.01) |

(52) U.S. Cl.
CPC .......... *G11C 16/26* (2013.01); *G11C 11/5642* (2013.01); *G11C 16/349* (2013.01); *G11C 29/021* (2013.01); *G11C 11/5628* (2013.01); *G11C 11/5635* (2013.01); *G11C 11/5671* (2013.01); *G11C 16/0408* (2013.01); *G11C 16/0466* (2013.01); *G11C 16/0483* (2013.01); *G11C 16/10* (2013.01); *G11C 16/14* (2013.01); *G11C 29/42* (2013.01); *G11C 2211/5631* (2013.01)

(58) Field of Classification Search
CPC ....... G11C 16/26; G11C 16/349; G11C 16/14; G11C 16/16
See application file for complete search history.

(56) References Cited

U.S. PATENT DOCUMENTS

| | | | | |
|---|---|---|---|---|
| 2010/0046289 | A1* | 2/2010 | Baek | G11C 11/5628 365/185.2 |
| 2018/0012667 | A1* | 1/2018 | Costa | G11C 16/0483 |
| 2018/0150261 | A1* | 5/2018 | Nam | G06F 3/0604 |
| 2019/0066802 | A1* | 2/2019 | Malshe | G11C 16/26 |

FOREIGN PATENT DOCUMENTS

| | | |
|---|---|---|
| KR | 1020140055739 | 5/2014 |
| KR | 1020150109120 | 10/2015 |
| KR | 1020170048805 | 5/2017 |

\* cited by examiner

*Primary Examiner* — Uyen B Tran
(74) *Attorney, Agent, or Firm* — IP & T Group LLP

(57) ABSTRACT

In a method for operating a semiconductor memory device including a plurality of memory blocks, the method includes: receiving a read command for a first memory block among the plurality of memory blocks; referring to a block read count value corresponding to the first memory block; determining whether the block read count value has reached a first threshold value; and performing a read operation on the first memory block, based on the determined result.

8 Claims, 12 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2017-0135208, filed on Oct. 18, 2017, which is incorporated herein by reference in its entirety.

BACKGROUND

1. Field of Invention

Various exemplary embodiments of the present disclosure generally relate to an electronic device. Particularly, the embodiments relate to a semiconductor memory device and an operating method thereof.

2. Description of the Related Art

A semiconductor memory device is a storage device implemented using a semiconductor such as silicon (Si), germanium (Ge), gallium arsenide (GaAs), or indium phosphide (InP). The semiconductor memory device is generally classified into a volatile memory device and a nonvolatile memory device.

The volatile memory device loses stored data when a power supply is cut off. Examples of the volatile memory include a static random access memory (SRAM), a dynamic RAM (DRAM), a synchronous DRAM (SDRAM), and the like. The nonvolatile memory device retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a semiconductor memory device having improved operational reliability.

Embodiments also provide an operating method of a semiconductor memory device having improved reliability.

According to an aspect of the present disclosure, there is provided a method for operating a semiconductor memory device including a plurality of memory blocks, the method including: receiving a read command for a memory block among the plurality of memory blocks; referring to a block read count value corresponding to the memory block; determining whether the block read count value has reached a threshold value; and performing a read operation on the first memory block based on the result of the determining operation.

The performing of the read operation on the memory block when it is determined that the block read count value reaches the threshold value, may include: performing a threshold voltage decrease operation of the memory block; and performing the read operation on the memory block.

The performing of the read operation on the memory block when it is determined that the block read count value does not reach the threshold value, may include performing the read operation on the memory block.

The performing of the threshold voltage decrease operation of the memory block may include: applying a first voltage having a positive value to a channel region of a cell string included in the memory block; and applying a second voltage smaller than the first voltage to word lines coupled to the memory block.

The method may further include, after performing the read operation on the memory block, increasing the read count value of the memory block.

According to an aspect of the present disclosure, there is provided a method for operating a semiconductor memory device including a plurality of memory blocks, the method including: receiving a read command for a memory block among the plurality of memory blocks; referring to a block read count value corresponding to the memory block; determining whether the block read count value has reached a threshold value; and performing a read operation on the memory block based on the result of the determining operation.

The performing of the read operation on the memory block when it is determined that the block read count value reaches the threshold value, may include: performing a threshold voltage increase operation on a select program state of the memory block; and performing a read operation on the memory block.

The performing of the read operation on the memory block when it is determined that the block read count value does not reach the threshold value, may include performing the read operation on the memory block.

The performing of the threshold voltage increase operation on the select program state of the memory block may include: applying a program permission voltage to a bit line coupled to a first memory cell having the select program state among memory cells included in a first page of the memory block; applying a program prohibition voltage to a bit line coupled to a second memory cell instead of the first memory cell among the memory cells included in the first page; and applying a third voltage having a positive value to a word line coupled to the memory cells included in the first page.

The third voltage may be determined to allow a threshold voltage of the first memory cell to drift.

The method may further include, after performing the read operation on the memory block, increasing the block read count value of the memory block.

According to an aspect of the present disclosure, there is provided a semiconductor memory device including: a memory cell array including a plurality of memory blocks; a peripheral circuit configured to perform any one of a read operation, a write operation, and an erase operation on the memory cell array; a block read counter configured to store a block read count value of each of the plurality of memory blocks; and control logic configured to control operations of the peripheral circuit and the block read counter, wherein, when a read command for a memory block among the plurality of memory blocks is received, the control logic controls the peripheral circuit and the block read counter to perform a read operation on the memory block, based on a block read count value of the memory block.

When the block read count value of the memory block reaches a first threshold value, the control logic may control the peripheral circuit to perform a threshold voltage decrease operation of the memory block and perform a read operation on the memory block.

When the block read count value does not reach the first threshold value, the control logic may control the peripheral circuit to perform the read operation on the memory block.

The threshold voltage decrease operation may be performed by applying a first voltage having a positive value to a channel region of a cell string included in the memory block, and applying a second voltage smaller than the first voltage to word lines coupled to the memory block.

When the block read count value of the memory block reaches a second threshold value, the control logic may control the peripheral circuit to increase a threshold voltage distribution in a select program state of the memory block and perform the read operation on the memory block.

When the block read count value of the memory block does not reach the second threshold value, the control logic may control the peripheral circuit to perform the read operation on the memory block.

An increase in threshold voltage distribution on the select program state of the first memory block may be performed by applying a program permission voltage to a bit line coupled to a first memory cell having the select program state among memory cells included in a first page of the memory block, applying a program prohibition voltage to a bit line coupled to a second memory cell instead of the first memory cell among the memory cells included in the first page, and applying a third voltage having a positive value to a word line coupled to the memory cells including in the first page.

After the read operation on the memory block is performed, the control logic may control the block read counter to increase the block read count value.

BRIEF DESCRIPTION OF THE DRAWINGS

Various embodiments will now be described in more detail with reference to the accompanying drawings; however, aspects and features of the disclosure may be configured or arranged differently than in the disclosed embodiments. Thus, the present disclosure is not to be construed as limited to the embodiments set forth herein. Rather, these embodiments are provided so that this disclosure will be thorough and complete, and will fully convey the scope of the present disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
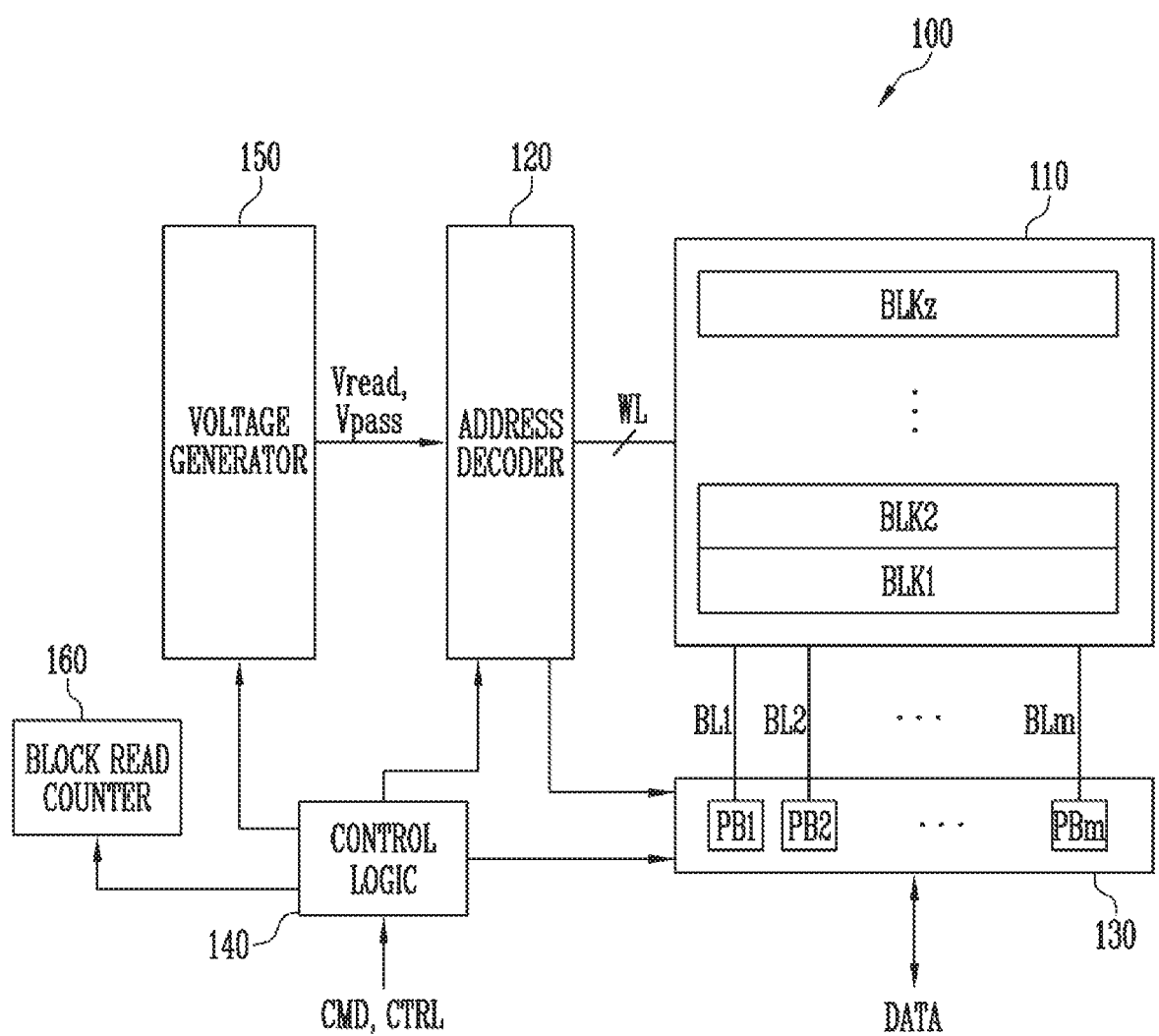
FIG. 1 is a block diagram illustrating a semiconductor memory device according to an embodiment of the present disclosure.

In the following detailed description, various embodiments of the present disclosure are shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component or components, such transition phrase indicates that the element may include not only the identified component(s) but one or more additional components, unless stated or the context requires otherwise.

Embodiments of the present disclosure will be described in detail with reference to the accompanying drawings. The same reference numerals are used to designate the same elements as those shown in other drawings. In the following description, only portions necessary for understanding operations according to the embodiments may be described; description of other portions may be omitted so as to not obscure important concepts of the embodiments. It is noted that reference to "an embodiment" does not necessarily mean only one embodiment, and different references to "an embodiment" are not necessarily to the same embodiment(s).

FIG. 1 is a block diagram illustrating a semiconductor memory device 100 according to an embodiment of the present disclosure.

Referring to FIG. 1, the semiconductor memory device 100 may include a memory cell array 110, an address decoder 120, a read/write circuit 130, a control logic 140, a voltage generator 150, and a block read counter 160.

The memory cell array 110 may include a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz may include a plurality of memory cells. In an embodiment, the plurality of memory cells are nonvolatile memory cells, which may be configured as having a vertical channel structure. The memory cell array 110 may be configured as having a two-dimensional structure. In some embodiments, the memory cell array 110 may be configured as having a three-dimensional structure.

Each of the plurality of memory cells included in the memory cell array 110 may store data of at least two bits. In an embodiment, each of the plurality of memory cells included in the memory cell array 110 may be a multi-level cell (MLC) that stores data of two bits. In another embodiment, each of the plurality of memory cells included in the memory cell array 110 may be a triple-level cell that stores data of three bits. In still another embodiment, each of the plurality of memory cells included in the memory cell array 110 may be a quad-level cell that stores data of four bits. In some embodiments, the memory cell array 110 may include a plurality of memory cells that each stores data of five or more bits.

The address decoder 120, the read/write circuit 130, and the voltage generator 150 operate as a peripheral circuit that drives the memory cell array 110. The address decoder 120 is coupled to the memory cell array 110 through the word lines WL. The address decoder 120 is configured to operate in response to the control of the control logic 140. The address decoder 120 receives an address through an input/output buffer (not shown) provided in the semiconductor memory device 100.

The address decoder 120 is configured to decode a block address in the received address. The address decoder 120 selects at least one memory block according to the decoded block address. In a read voltage application operation during a read operation, the address decoder 120 applies a read voltage Vread generated by the voltage generator 150 to a selected word line among the selected memory blocks, and applies a pass voltage Vpass to the other unselected word lines. In a program verify operation, the address decoder 120 applies a verify voltage generated by the voltage generator 150 to the selected word line among the selected memory blocks, and applies the pass voltage Vpass to the other unselected word lines.

The address decoder 120 is configured to decode a column address in the received address. The address decoder 120 transmits the decoded column address to the read/write circuit 130.

Read and program operations of the semiconductor memory device 100 are performed in units of pages. An address received in a request of the read operation and the program operation may include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 may include a plurality of page buffers PB1 to PBm. The read/write circuit 130 may operate as a "read circuit" when performing a read operation of the memory cell array 110, and operate as a "write circuit" when performing a write operation of the memory cell array 110. The plurality of page buffers PB1 to PBm are coupled to the memory cell array 110 through the bit lines BL1 to BLm. In order to sense threshold voltages of memory cells in the read operation and the program verify operation, the plurality of page buffers PB1 to PBm sense a change in amount of current flowing depending on a program state of a corresponding memory cell while continuously supplying sensing current to bit lines coupled to the memory cells, and latch the sensed change as sensing data. The read/write circuit 130 operates in response to page buffer control signals output from the control logic 140.

In the read operation, the read/write circuit 130 temporarily stores read data by sensing data of a memory cell and then outputs data DATA to the input/output buffer (not shown) of the semiconductor memory device 100. In an exemplary embodiment, the read/write circuit 130 may include a column selection circuit, and the like, in addition to the page buffers (or page registers).

The control logic 140 is coupled to the address decoder 120, the read/write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. Also, the control logic 140 outputs a control signal for controlling sensing node precharge potential levels of the plurality of page buffers PB1 to PBm. The control logic 140 may control the read/write circuit 130 to perform the read operation of the memory cell array 110.

In the read operation, the voltage generator 150 generates the read voltage Vread and the pass voltage Vpass in response to a voltage generating unit control signal output from the control logic 140.

The block read counter 160 counts and stores a number of times of reading each of the plurality of memory blocks BLK1 to BLKz in the memory cell array 110. The number of times of reading may be designated as a "block read count value." For example, a block read count value of each memory block is reset when the corresponding memory block is erased or programmed. After this, whenever a read operation is performed on the corresponding memory block, the block read count value is increased by 1.

Although FIG. 1 shows the block read counter 160 as a component implemented separate and independent from the control logic 140, the present disclosure is not limited thereto. That is, the block read counter 160 may be included in the control logic 140.

In the semiconductor memory device 100 according to an embodiment of the present disclosure, when a read command for any one of the plurality of memory blocks BLK1 to BLKz is received, a block read count value of the corresponding memory block is referenced.

When the block read count value reaches a specific threshold value, the control logic 140 control the peripheral circuit to perform a threshold voltage decrease operation on the corresponding memory block or increase a threshold voltage distribution corresponding to a first program state of the corresponding memory block.

A threshold voltage decrease operation on a memory block will be described below with reference to FIGS. 9 and 10. An operation of increasing a threshold voltage distribution corresponding to the first program state will be described below with reference to FIGS. 11 and 12.

The semiconductor memory device 100 according to an embodiment of the present disclosure performs the above-described threshold voltage decrease operation, so that it is possible to reduce "lateral charge drift." Further, the semiconductor memory device 100 according to an embodiment of the present disclosure increases the threshold voltage distribution corresponding to the first program state, so that it is possible to ensure the read margin of a first read voltage. Accordingly, the operational reliability of the semiconductor memory device 100 is improved.

Figure 2:
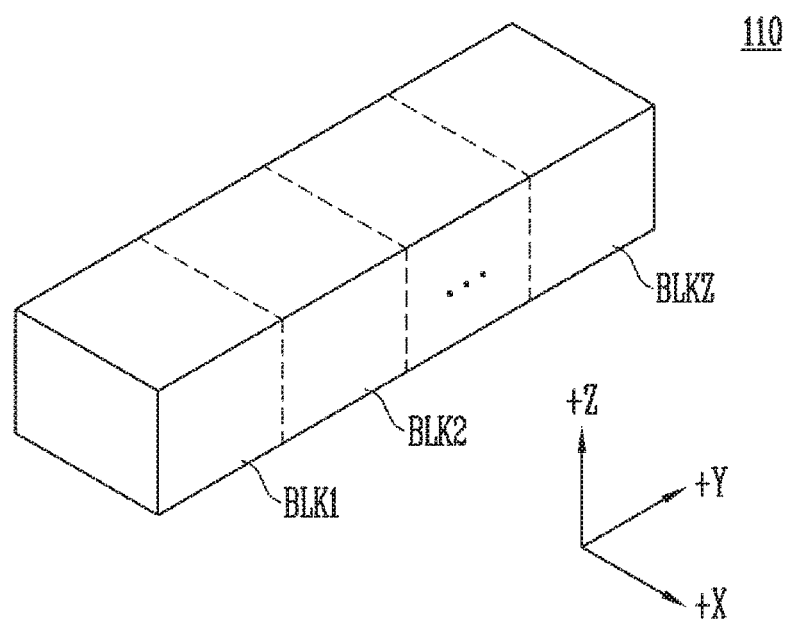
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 may include a plurality of memory blocks BLK1 to BLKz. Each memory block may have a three-dimensional structure. Each memory block may include a plurality of memory cells stacked above a substrate. The plurality of memory cells are arranged along +X, +Y, and +Z directions shown in FIG. 2. The structure of each memory block configured as a three-dimensional structure will be described in more detail with reference to FIGS. 4 and 5. The present invention, however, is not limited to a memory array with each block having a three-dimensional structure as shown in FIG. 2. Rather, each memory block of the memory cell array 110 may have a two-dimensional structure, as shown in FIG. 3 and described below with reference thereto.

Figure 3:
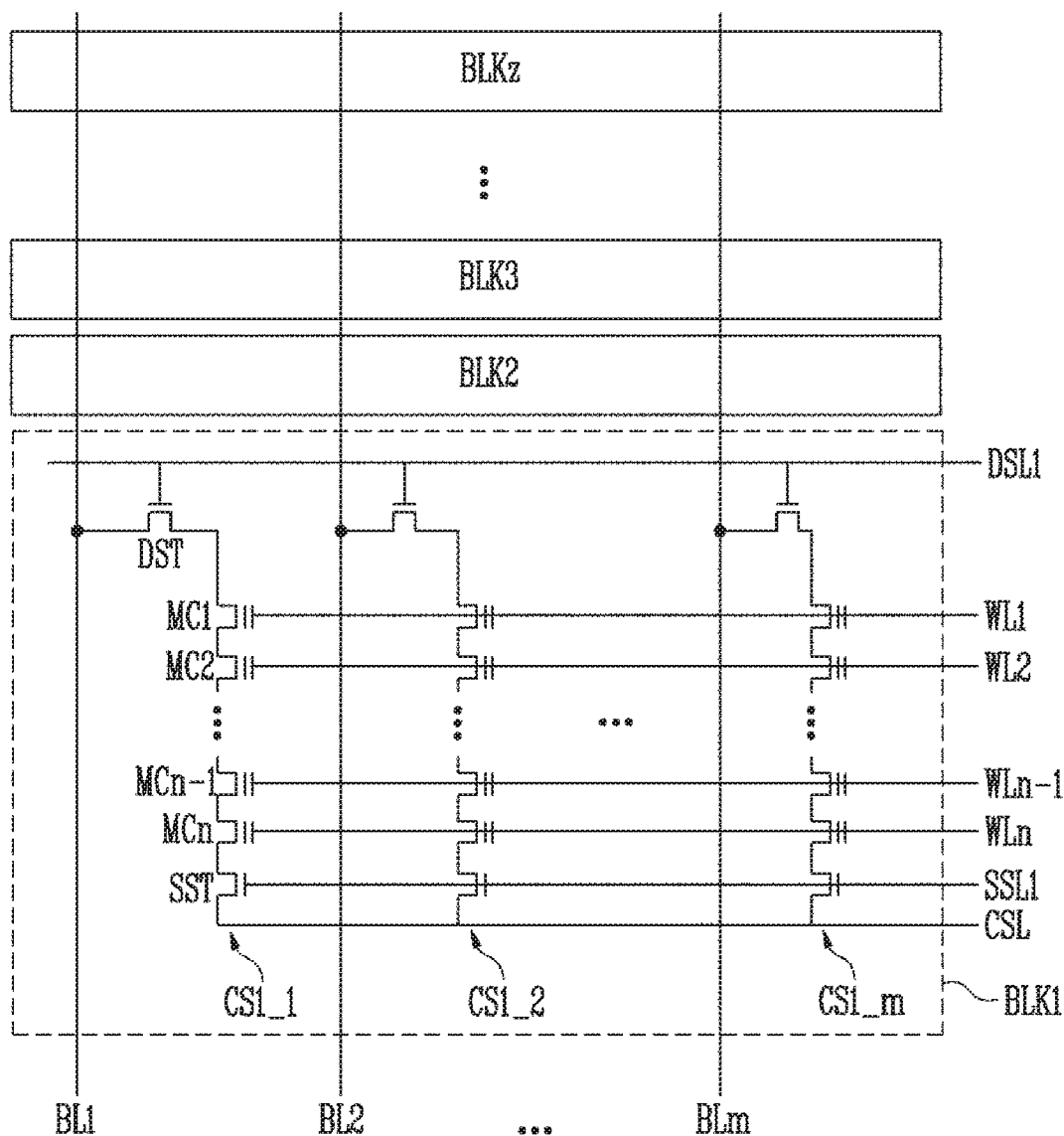
FIG. 3 is a diagram illustrating an embodiment of the memory cell array of FIG. 1.

FIG. 3 is a diagram illustrating an embodiment of the memory cell array 110 of FIG. 1. In FIG. 3, the memory cell array is identified by the reference numeral 110_1.

Referring to FIG. 3, first to zth memory blocks BLK1 to BLKz included in the memory cell array 110_1 are commonly coupled to first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_*m*. First to mth cell strings CS1_1 to CS1_*m* are coupled to the first to mth bit lines BL1 to BLm, respectively.

Each of the first to mth cell strings CS1_1 to CS1_*m* may include a drain select transistor DST, a plurality of memory cells MC1 to MCn coupled in series, and a source select transistor SST. The drain select transistor DST is coupled to a drain select line DSL1. First to nth memory cells MC1 to MCn are coupled to first to nth word lines WL1 to WLn, respectively. The source select transistor SST is coupled to a source select line SSL1. A drain of the drain select transistor DST is coupled to a corresponding bit line. The drain select transistors of the first to mth cell strings CS1_1 to CS1_*m* are coupled to the first to mth bit lines BL1 to BLm, respectively. A source of the source select transistor SST is coupled to a common source line CSL. In an embodiment, the common source line CSL may be commonly coupled to the first to zth memory blocks BLK1 to BLKz.

The drain select line DSL1, the first to nth word lines WL1 to WLn, and the source select line SSL1 are controlled by the address decoder 120. The common source line CSL is controlled by the control logic 140. The first to mth bit lines BL1 to BLm are controlled by the read/write circuit 130.

Accordingly, in an embodiment, the memory cell array 110 of the semiconductor memory device 100 shown in FIG. 1 may be configured as the memory cell array 110_1 having the two-dimensional structure as shown in FIG. 3. However, in one or more other embodiments, the memory cell array 110 of the semiconductor memory device 100 may be configured as a memory cell array having a three-dimensional structure. The memory cell array having the three-dimensional structure will be described below with reference to FIGS. 4 and 5.

Figure 4:
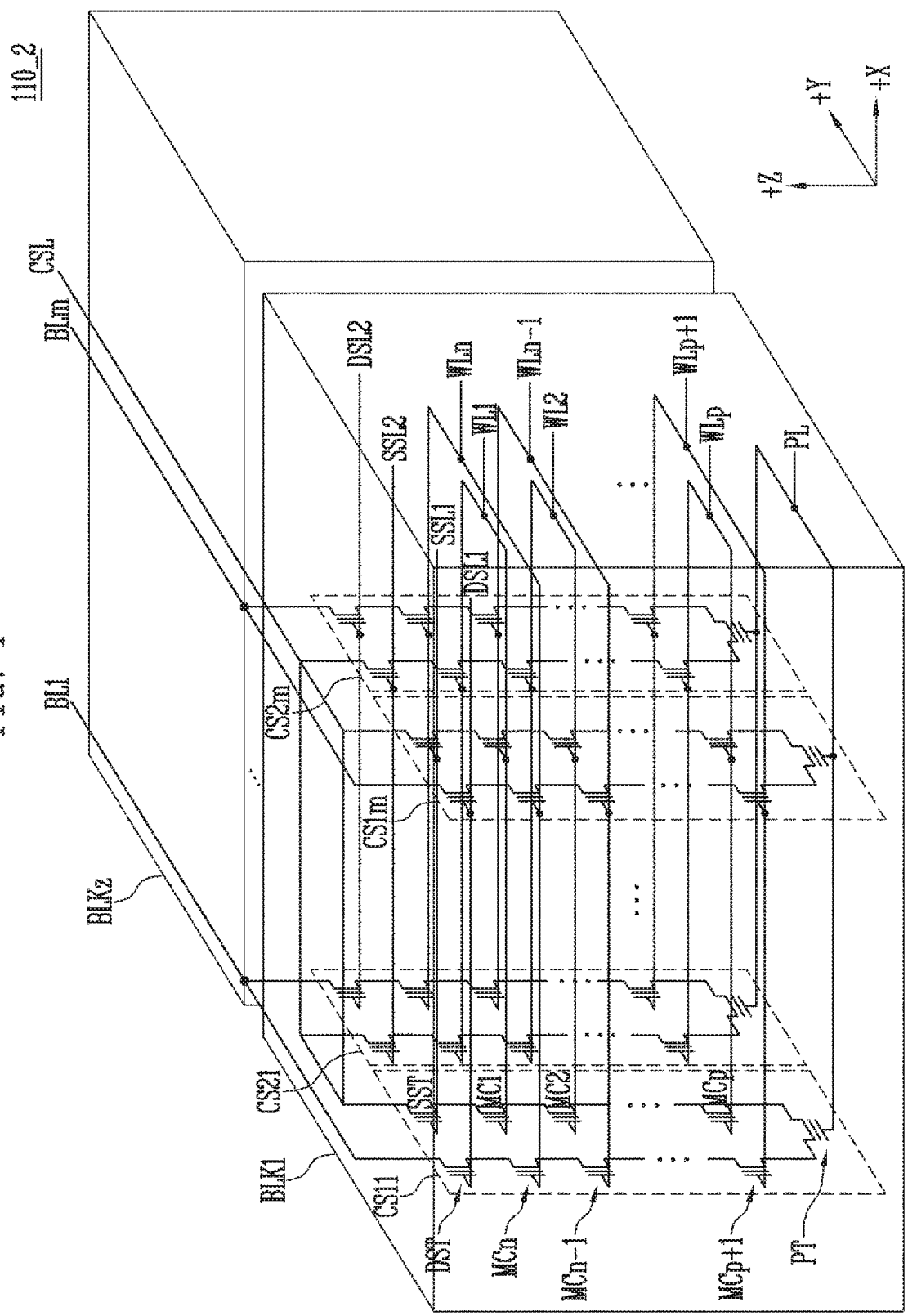
FIG. 4 is a diagram illustrating an embodiment of the memory cell array of FIG. 1.

FIG. 4 is a diagram illustrating an embodiment of the memory cell array 110 of FIG. 1. In FIG. 4, the memory cell array is identified by the reference numeral 110_2.

Referring to FIG. 4, the memory cell array 110_2 may include a plurality of memory blocks BLK1 to BLKz. In FIG. 4, for convenience of description, an internal configuration of a first memory block BLK1 is illustrated, and internal configurations of the other memory blocks BLK2 to BLKz are omitted. It will be understood that second to zth memory blocks BLK2 to BLKz are configured identically to the first memory block BLK1.

The first memory block BLK1 may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the first memory block BLK1, m cell strings are arranged in a row direction (i.e., a +X direction). In FIG. 4, it is illustrated that two cell strings are arranged in a column direction (i.e., a +Y direction). However, this is for convenience of description; it will be understood that three or more cell strings may be arranged in the column direction.

Each of the plurality of cell strings CS11 to CS1*m* and CS21 to CS2*m* may include at least one source select transistor SST, first to nth memory cells MC1 to MCn, a pipe transistor PT, and at least one drain select transistor DST.

Each of the SSTs may have a similar structure, each of the DSTs may have a similar structure, and each of the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1*m* on a first row are coupled to a first source select line SSL1. The source select transistors of the cell strings CS21 to CS2*m* on a second row are coupled to a second source select line SSL2.

In another embodiment, the source select transistors of the cell strings CS11 to CS1*m* and CS21 to CS2*m* may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp are sequentially arranged in a −Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

Figure 5:
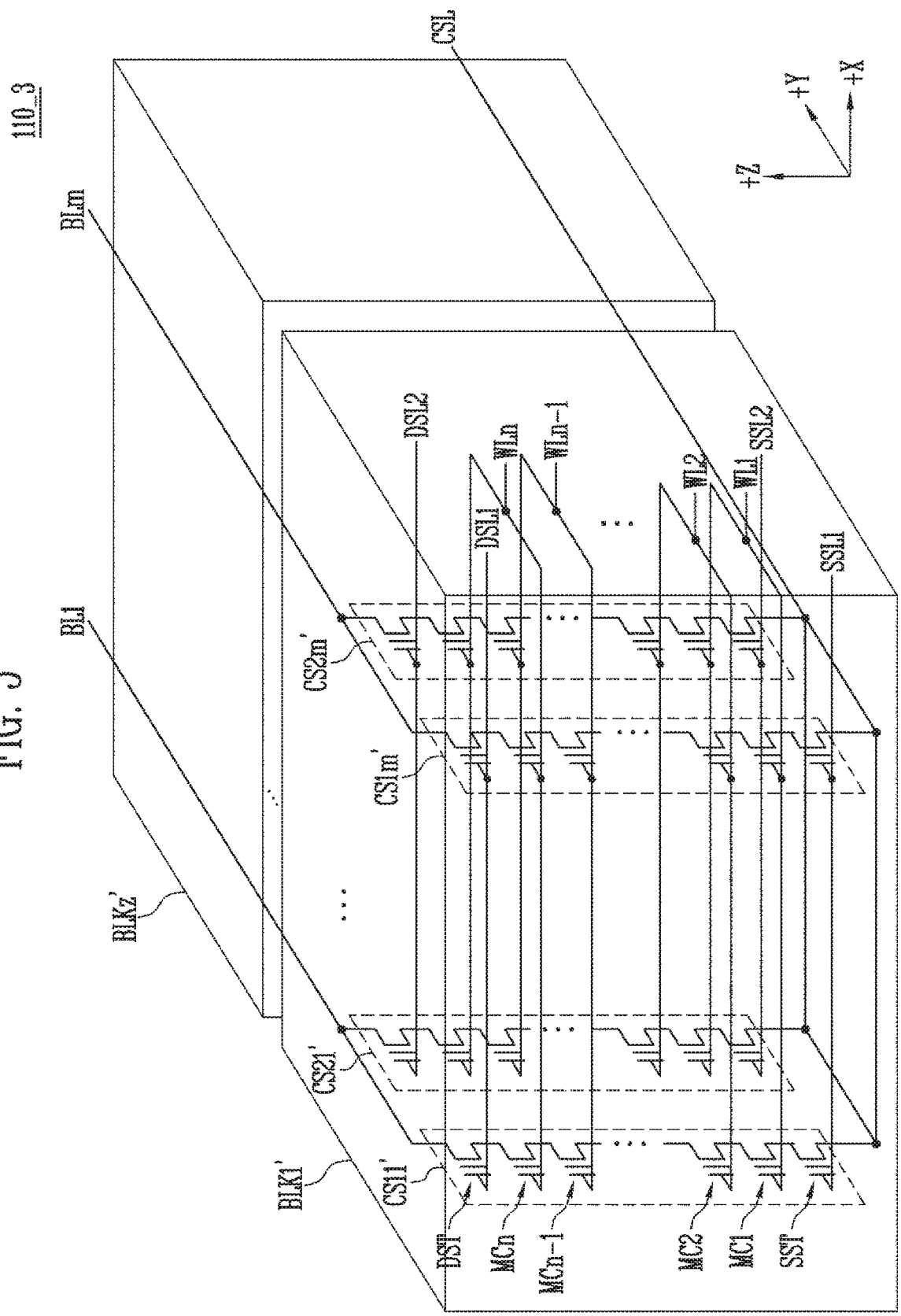
FIG. 5 is a diagram illustrating an embodiment of the memory cell array of FIG. 1.

FIG. 5 is a diagram illustrating an embodiment of the memory cell array 110 of FIG. 1. In FIG. 5, the memory cell array is identified by the reference numeral 110_3.

Referring to FIG. 5, the memory cell array 110_3 may include a plurality of memory blocks BLK1' to BLKz'. In FIG. 5, for convenience of description, an internal configuration of a first memory block BLK1' is illustrated, and internal configurations of the other memory blocks BLK2' to BLKz' are omitted. It will be understood that second to zth memory blocks BLK2' to BLKz' are configured identically to the first memory block BLK1'.

The first memory block BLK1' may include a plurality of cell strings CS11' to CS1m' and CS21' to CS2m'. Each of the plurality of cell strings CS11' to CS1m' and CS21' to CS2m' extends along the +Z direction. In the first memory block BLK1', m cell strings are arranged in the +X direction. In FIG. 5, it is illustrated that two cell strings are arranged in the +Y direction. However, this is for convenience of description; it will be understood that three or more cell strings may be arranged in the column direction.

Each of the plurality of cell strings CS11' to CS1m' and CS21' to CS2m' may include at least one source select transistor SST, first to nth memory cells MC1 to MCn, and at least one drain select transistor DST.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2.

In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLK1' of FIG. 5 has circuit structure similar to that of the memory block BLK1 of FIG. 4, except that the pipe transistor PT is excluded from each cell string.

Figure 6:
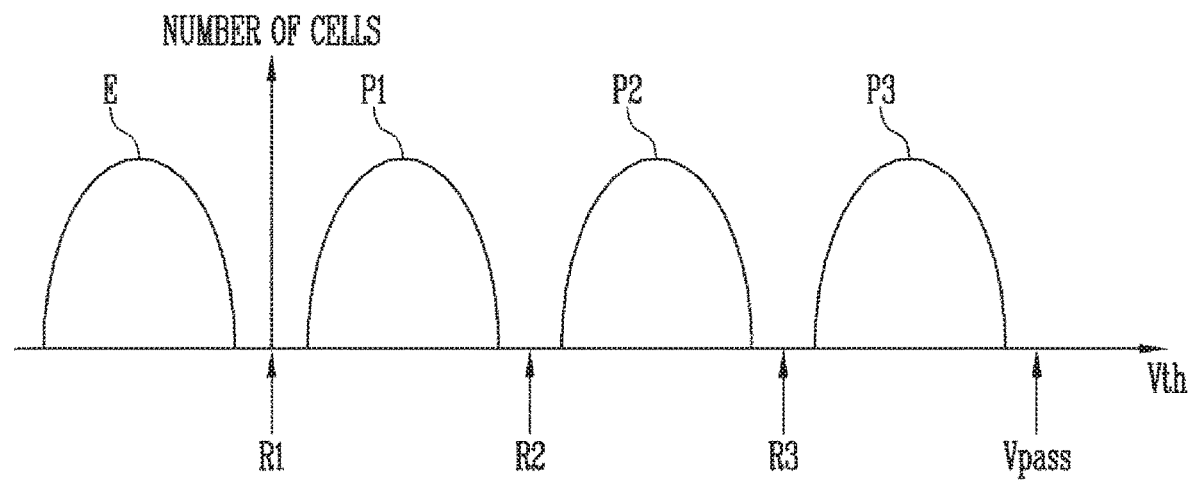
FIG. 6 is a diagram illustrating a threshold voltage distribution of multi-level cells.

FIG. 6 is a diagram illustrating a threshold voltage distribution of multi-level cells.

Referring to FIG. 6, the threshold voltage of each programmed memory cell included in a memory block is included in any one of an erase state E, a first program state P1, a second program state P2, and a third program state P3. In a read operation, read voltages R1, R2, and R3 are applied to a word line coupled to a selected page, and a pass voltage Vpass is applied to a word line coupled to an unselected page.

Figure 7:
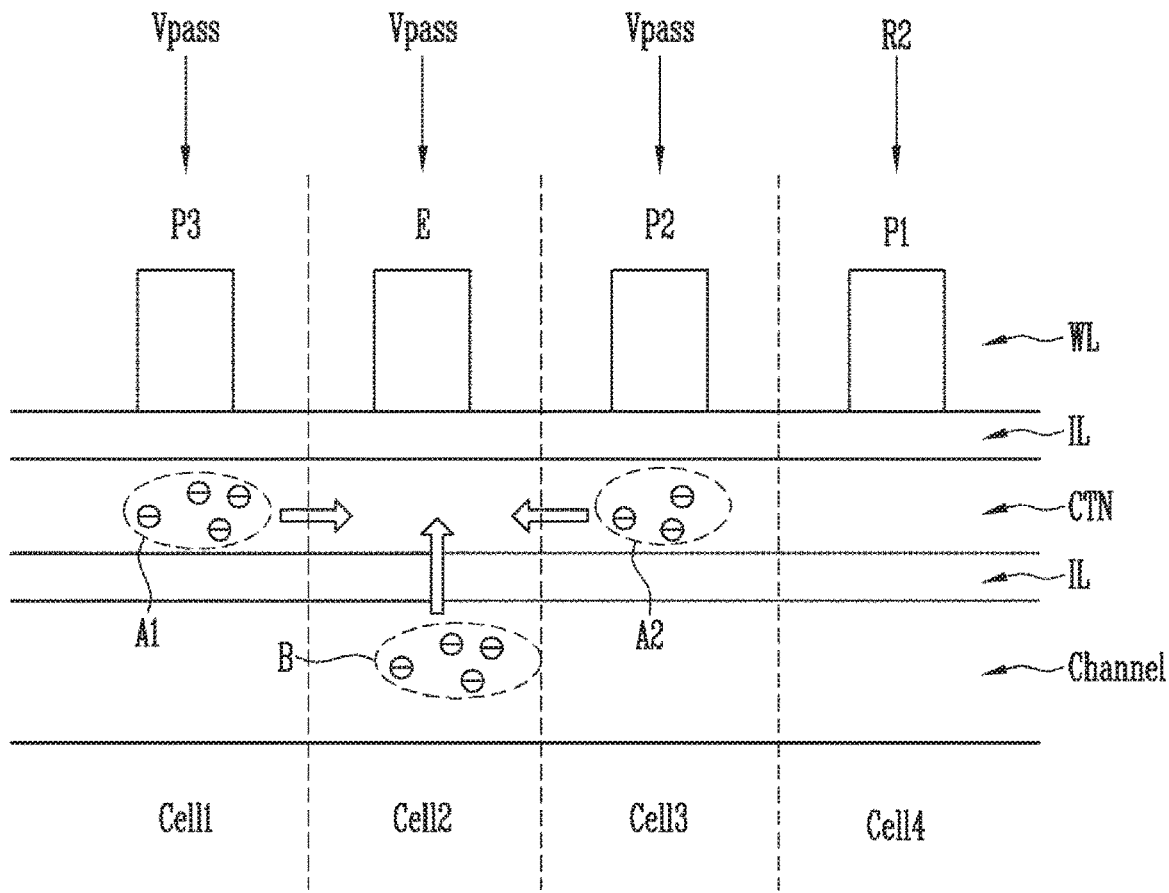
FIG. 7 is a diagram illustrating an increase in threshold voltage of memory cells in an erase state.

FIG. 7 is a diagram illustrating an increase in threshold voltage of memory cells in an erase state.

Referring to FIG. 7, a sectional diagram of a portion of a memory cell string having a three-dimensional structure is illustrated. As shown in FIG. 7, the memory cell string has a structure in which a channel layer Channel, an insulating layer IL, a charge storage layer CTN, an insulating layer IL, and a word line WL are sequentially stacked. In FIG. 7, only a section of the pertinent portion of the memory cell string is illustrated to provide the necessary description.

For convenience of description, four word lines among more are illustrated. Each word line forms a memory cell: Cell1, Cell2, Cell3, or Cell4 through the insulating layers IL, the charge storage layer CTN, and the channel layer Channel in a corresponding region. In FIG. 7, a first memory cell Cell1 is programmed in a third program state P3, a second memory cell Cell2 has a threshold voltage of an erase state E, and third and fourth memory cells Cell3 and Cell4 are programmed in second and first program states P2 and P1, respectively. A state in which a read operation is performed on the fourth memory cell Cell4 is illustrated in FIG. 7.

In order to perform the read operation on the fourth memory cell Cell4, a second read voltage R2 may be applied to the word line WL coupled to the fourth memory cell Cell4. Then, a first read voltage R1 and a third read voltage R3 may be applied to the word line WL coupled to the fourth memory cell Cell4.

In order to perform the read operation on the fourth memory cell Cell4, a pass voltage Vpass may be applied to the word lines WL coupled to the first to third memory cells Cell1 to Cell3.

As shown in FIG. 6, the pass voltage Vpass is a relatively high voltage, higher than the first to third read voltages R1 to R3. As the high pass voltage Vpass is applied to the word line WL of the second memory cell Cell2 having the threshold voltage of the erase state E, charges B of the channel layer Channel may be introduced into the charge storage layer CTN by passing through the insulating layer IL. The threshold voltage of the second memory cell Cell2 may be increased as the charges B drift.

In addition, the first memory cell Cell1 and the third memory cell Cell3, which are adjacent to the second memory cell Cell2, have relatively high threshold voltages, which results in an increase in threshold voltage of the second memory cell Cell2 in the erase state E. That is, as the pass voltage Vpass is applied to the word line WL of the second memory cell Cell2, at least some of charges A1 and A2 located in the charge storage layers CNT of the first memory cell Cell1 and the third memory cell Cell3 drift to a region of the charge storage layer CNT of the second memory cell Cell2. Such "lateral charge drift" becomes more serious as threshold voltages of adjacent memory cells become higher. Therefore, as the read operation is repeated, the threshold voltages of memory cells in the erase state E are gradually increased, which has bad influence on a read margin.

Figure 8:
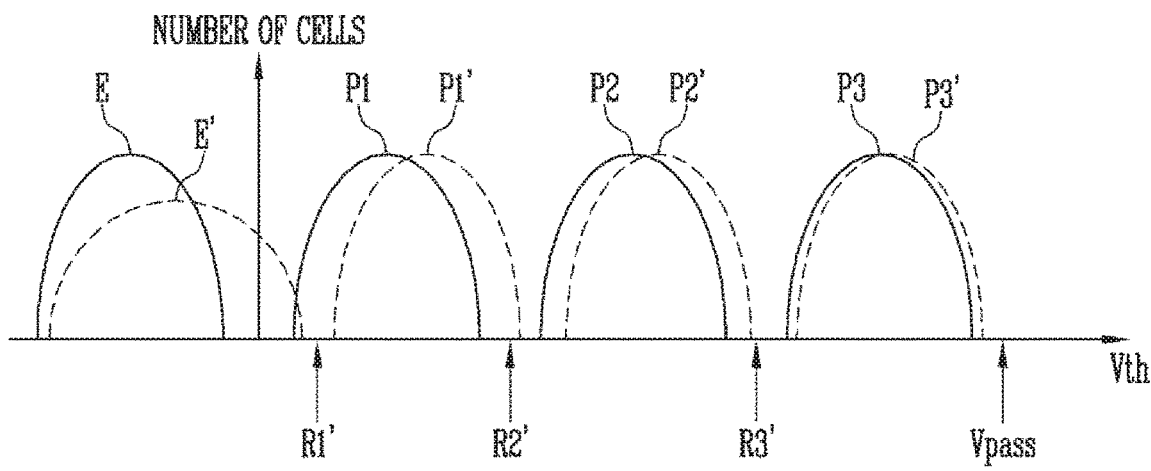
FIG. 8 is a diagram illustrating drift of threshold voltages of memory cells as a read operation is repeated.

FIG. 8 is a diagram illustrating drift of threshold voltages of memory cells as a read operation is repeated.

As described with reference to FIGS. 6 and 7, the threshold voltages of memory cells are increased as the read operation on a specific memory block is repeated. As shown in FIG. 8, a threshold voltage distribution in the erase state E drifts to that in a state E', a threshold voltage distribution in the first program state P1 drifts to that in a state P1', a threshold voltage distribution in the second program state P2 drifts to that in a state P2', and a threshold voltage distribution in the third program state P3 drifts to that in a state P3'. Accordingly, read voltages R1', R2', and R3' suitable for the drifted threshold voltage distributions are selected.

As shown in FIG. 8, the degree of drift of a threshold voltage distribution becomes larger as a memory cell threshold voltage becomes lower. That is, the degree of drift of the threshold voltage distribution of memory cells in the erase state E is largest, and the degree of drift of the threshold voltage distribution of memory cells in the first program state P1 is second largest. The degree of drift of the threshold voltage distribution of memory cells in the third program state P3 is smallest. According to FIG. 8, since the degree of drift of the threshold voltage distribution of memory cells in the erase state E is largest, the read margin of a first read voltage R1' is most degraded. Accordingly, it is required to ensure the read margin of the first read voltage R1'.

As described with reference to FIG. 7, the charges B introduced into the charge storage layer CTN from the channel layer Channel become the factor that increases the threshold voltage of a memory cell in the erase state E. However, the charges A1 and A2 introduced in the charge storage layer CTN of the memory cell in the erase state E from the charge storage layer CTN of the adjacent memory cells having high threshold voltages also become the factor that increases the threshold voltage of a memory cell in the erase state E.

According to the present disclosure, if a block read count value of a memory block reaches a specific threshold value, the threshold voltage distribution of memory cells in the third program state P3 is decreased, so that the "lateral charge drift" is suppressed. Thus, the phenomenon of increased threshold voltage distribution of memory cells in the erase state E can be prevented as much as possible, and the read margin of the first read voltage R1 or R1' can be ensured. Accordingly, the operational reliability of the semiconductor memory device 100 can be improved.

Figure 9:
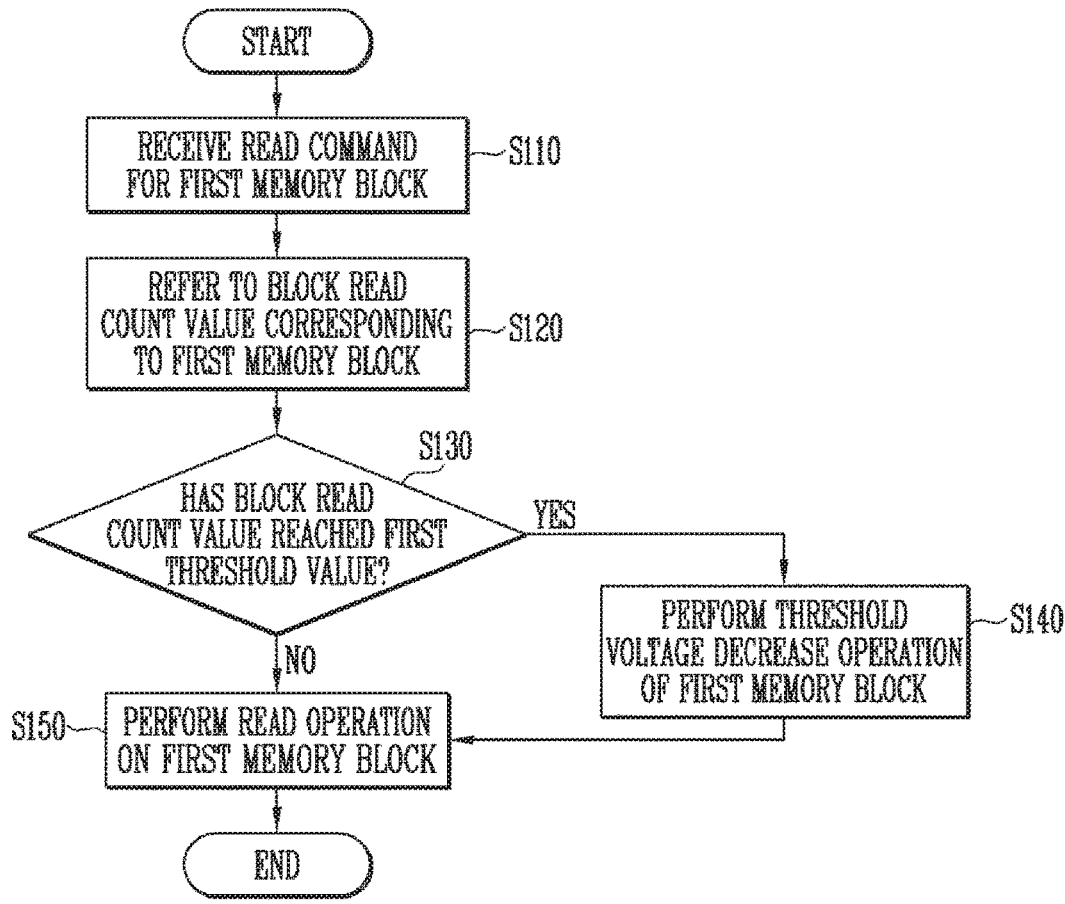
FIG. 9 is a flowchart describing an operating method of the semiconductor memory device according to an embodiment of the present disclosure.

FIG. 9 is a flowchart describing an operating method of the semiconductor memory device 100 according to an embodiment of the present disclosure.

Referring to FIG. 9, the semiconductor memory device 100 receives a read command for a first memory block from a controller at step S110.

Then, the semiconductor memory device 100 refers to a block read count value corresponding to the first memory block at step S120.

Subsequently, the semiconductor memory device 100 determines whether the referred block read count value has reached a first threshold value at step S130.

When the block read count value reaches the first threshold value, the semiconductor memory device 100 performs a threshold voltage decrease operation of the first memory block at step S140, and then performs a read operation on the first memory block at step S150.

When the block read count value does not reach the first threshold value, the semiconductor memory device 100 does not perform the threshold voltage decrease operation but performs the read operation on the first memory block at step S150.

The steps of FIG. 9 will now be described in detail with additional reference to FIG. 1.

In step S110, the semiconductor memory device 100 receives a read command for a first memory block from the controller. The received read command may be transferred to the control logic 140. The first memory block is any one of the memory blocks BLK1 to BLKz included in the memory cell array 110, and may be a memory block on which a program operation has already been performed.

In step S120, the control logic 140 refers to the block read count value corresponding to the first memory block on which a read operation is to be performed. To this end, the control logic 140 may transfer identification information of the first memory block to the block read counter 160. The block read counter 160 may transfer, to the control logic 140, the block read count value indicating how many times the read operation has been performed on the first memory block after the first memory block is programmed, based on the identification information received from the control logic 140.

In step S130, the control logic 140 determines whether the received block read count value has reached a first threshold value. The first threshold value may be determined and set based on operating parameters. For example, the first threshold value may be a value of 100. In this case, the control logic 140 may determine whether the block read count value has reached the value of 100. When the block read count value reaches the value of 100, the semiconductor memory device 100 performs a threshold voltage decrease operation of the first memory block by proceeding to step S140.

The first threshold value may have a plurality of sub-values. For example, the first threshold value may include multiples of 100 as the sub-values. In this case, the control logic 140 determines whether the semiconductor memory device 100 is to proceed to the step S140 by determining whether the block read count value has reached the multiples of 100 such as 100, 200, 300, 400, etc. In the above example, whenever the block read count value reaches each of the multiples of 100, the semiconductor memory device 100 may perform the threshold voltage decrease operation of the first memory block by proceeding to the step S140.

In the step S140, the semiconductor memory device 100 performs the threshold voltage decrease operation of the first memory block. The threshold voltage decrease operation may be performed similarly to an erase operation of a memory block. As an example, the threshold voltage decrease operation may be performed by applying a first voltage having a positive value to the channel regions Channel of all memory cells included in the first memory block, and applying a second voltage smaller than the first voltage to the word lines WL coupled to the first memory block. The first voltage and the second voltage may be selected as voltages that are not used to erase the first memory block but used to allow a threshold voltage to be slightly decreased. Accordingly, some of the charges A1 and A2 in the charge storage layer CTN of FIG. 7 can escape to the channel layer. Thus, the amount of charges located in the charge storage layer CNT of the memory cells Cell1 and Cell3 adjacent to the memory cell Cell2 in the erase state E is decreased, and the "lateral charge drift" can be reduced even when the read operation is repeated later.

After the step S140 is performed, the semiconductor memory device 100 performs a read operation on the first memory block at step S150.

Although not shown in FIG. 9, if the read operation on the first memory block is completed, the block read count value of the first memory block, which is stored in the block read counter 160, may be increased by 1.

Figure 10:
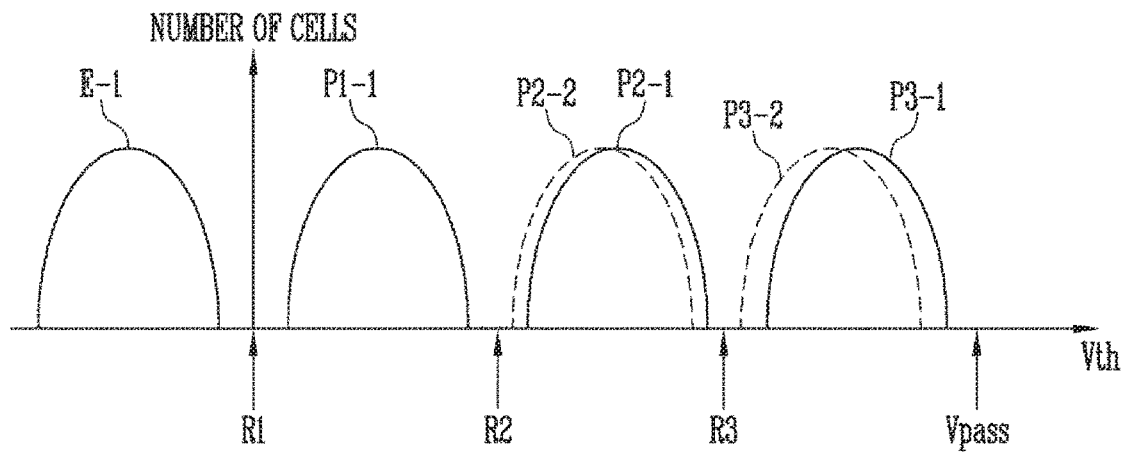
FIG. 10 is a diagram illustrating a change in threshold voltage distribution of memory cells as a threshold voltage decrease operation of FIG. 9 is performed.

FIG. 10 is a diagram illustrating a change in threshold voltage distribution of memory cells as the threshold voltage decrease operation of FIG. 9 is performed.

Referring to FIG. 10, the threshold voltages of the memory cells drift due to the threshold voltage decrease operation to the first memory block performed at step S140 of FIG. 9. Specifically, the threshold voltage distribution of the memory cells in the third program state drifts from a distribution P3-1 to a distribution P3-2. In addition, the threshold voltage distribution of the memory cells in the second program state drifts from a distribution P2-1 to a distribution P2-2. A drift width of the threshold voltage distribution of the memory cells in the second program state may be smaller than that that of the threshold voltage distribution of the memory cells in the third program state.

A threshold voltage distribution P1-1 of the memory cells in the first program state and a threshold voltage distribution E-1 of the memory cells in the erase state may also drift. However, drift widths of the threshold voltage distribution P1-1 and the threshold voltage distribution E-1 are smaller than that of the threshold voltage distribution of the memory cells in the third program state, and therefore, their illustration is omitted.

As described with reference to FIGS. 9 and 10, in the semiconductor memory device 100 and the operating method thereof according to the present disclosure, the threshold voltage decrease operation of step S140 on a corresponding memory block is performed whenever the block read count value reaches a specific threshold value. Accordingly, the threshold voltage distributions of the memory cells having relatively high threshold voltages in the second and third program states P2 and P3 are decreased, which result in reduction of the "lateral charge drift" in which charges drift to the memory cells in the erase state E. Thus, an increase in threshold voltage of the memory cells in the erase state E is suppressed even when the read operation is repeated, and the read margin of the first read voltage R1 can be ensured. Accordingly, the operational reliability of the semiconductor memory device can be improved.

Figure 11:
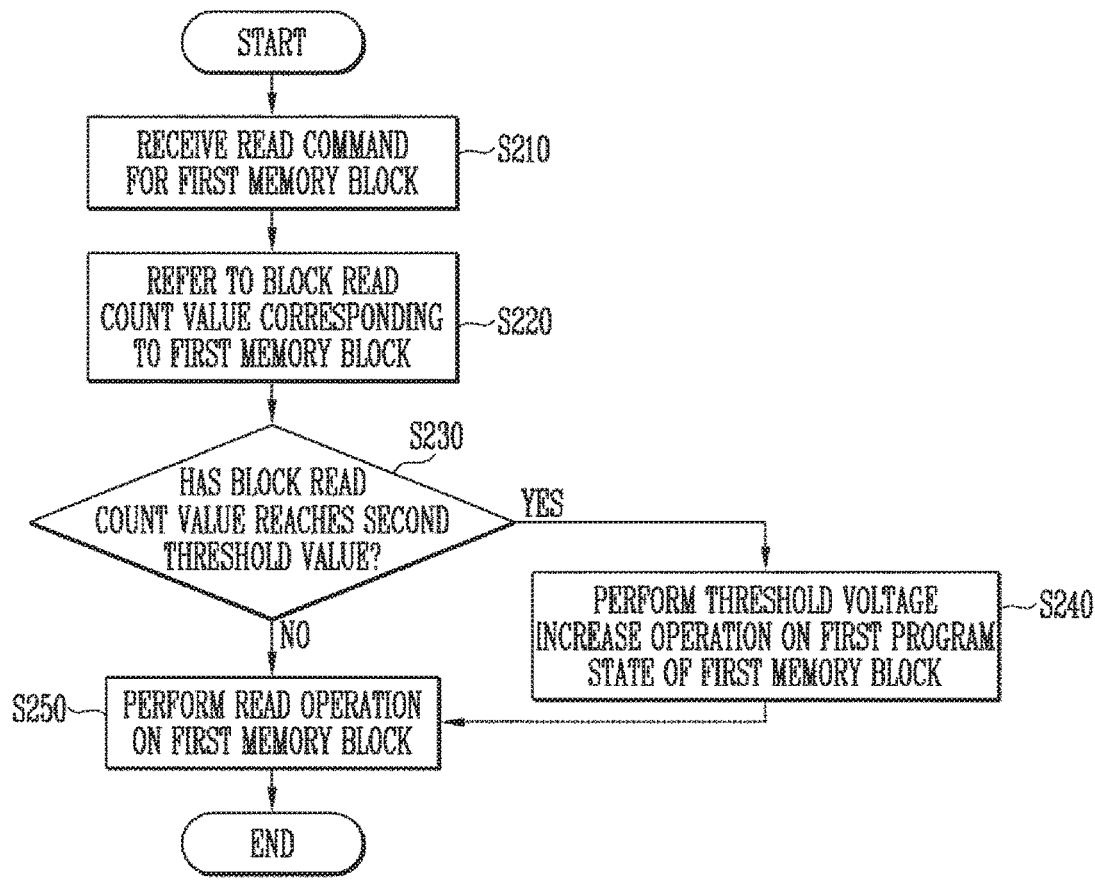
FIG. 11 is a flowchart describing an operating method of the semiconductor memory device according to another embodiment of the present disclosure.

FIG. 11 is a flowchart illustrating an operating method of the semiconductor memory device 100 according to another embodiment of the present disclosure.

Referring to FIG. 11, the semiconductor memory device 100 receives a read command from a first memory block at step S210.

Then, the semiconductor memory device 100 refers to a block read count value corresponding to the first memory block at step S220.

Subsequently, the semiconductor memory device 100 determines whether the referred block read count value has reached a second threshold value at step S230.

When the block read count value reaches the second threshold value, the semiconductor memory device 100 performs a threshold voltage increase operation on the first program state P1 of the first memory block at step S240 and then performs a read operation on the first memory block at step S250.

When the block read count value does not reach the second threshold value, the semiconductor memory device 100 does not perform the threshold voltage increase operation on the first program state P1 but performs the read operation on the first memory block at step S250.

The steps of FIG. 11 will now be described in detail 100 additional reference to FIG. 1.

In step S210, the semiconductor memory device 100 receives a read command for a first memory block from the controller. The received read command may be transferred to the control logic 140. The first memory block is any one of the memory blocks BLK1 to BLKz included in the memory cell array 110, and may be a memory block on which a program operation has already been performed.

In step S220, the control logic 140 refers to the block read count value corresponding to the first memory block on which a read operation is to be performed. To this end, the control logic 140 may transfer identification information of the first memory block to the block read counter 160. The block read counter 160 may transfer, to the control logic 140, the block read count value indicating how many times the read operation has been performed on the first memory block after the first memory block is programmed, based on the identification information received from the control logic 140.

In step S230, the control logic 140 determines whether the received block read count value has reached a second threshold value. The second threshold value may be determined and set based on operating parameters. The second threshold value may be different than, and used independently of, the first threshold value described with reference to FIG. 9. Also, the second threshold value may be equal to or different from the first threshold value. For example, the second threshold value may have a value of 150. In this case, the control logic 140 may determine whether the block read count value has reached the value of 150. When the block read count value reaches the value of 150, the semiconductor memory device 100 performs a threshold voltage increase operation on the first program state P1 of the first memory block by proceeding to step S240.

The second threshold value may have a plurality of sub-values. For example, the second threshold value may include multiples of 150 as the sub-values. In this case, the control logic 140 determines whether the semiconductor memory device 100 is to proceed to the step S240 by determining whether the block read count value has reached the multiples of 100 such as 150, 300, 450, 600, etc. In the above example, whenever the block read count value reaches each of the multiples of 150, the semiconductor memory device 100 may perform the threshold voltage increase operation on the first program state P1 of the first memory block by proceeding to the step S240.

In the step S240, the semiconductor memory device 100 performs the threshold voltage increase operation on the first program state P1 of the first memory block. The threshold voltage increase operation is performed to ensure the read margin of the first read voltage R1 by widening a distance between the threshold voltage distribution in the erase state E and the threshold voltage distribution in the first program state P1.

The step S240 may be performed similarly to a program operation of memory cells in the first program state P1. As an example, the threshold voltages of the memory cells in the first program state P1 may be slightly increased by applying a program pulse to the memory cells in the first program state P1 among the memory cells included in the first memory block. To this end, the control logic 140 may detect which memory cell among memory cells included in each page corresponds to the first program state P1 by sequentially performing a read operation on each page of the first memory block. Then, based on the detected result, the control logic 140 may increase the threshold voltage distribution of memory cells corresponding to the first program state P1 by applying a program permission voltage to bit lines coupled to the memory cells corresponding to the first program state P1 among the memory cells included in the corresponding page, applying a program prohibition voltage to bit lines coupled to the other memory cells, and then applying, at least once, a program pulse to a word line coupled to the corresponding page.

In the step S240 of FIG. 11, it is illustrated that the threshold voltage distribution of the memory cells corresponding to the first program state P1 is increased. Additionally, a threshold voltage distribution may be increased with respect to memory cells corresponding to the second program state P2 or memory cells corresponding to the third program state P3. In this case, the read margin of the second read voltage R2 or the third read voltage R3 can also be improved.

After the step S240 is performed, the semiconductor memory device 100 performs a read operation on the first memory block at step S250.

Although not shown in FIG. 11, if the read operation on the first memory block is completed, the block read count value of the first memory block, which is stored in the block read counter 160, may be increased by 1.

Figure 12:
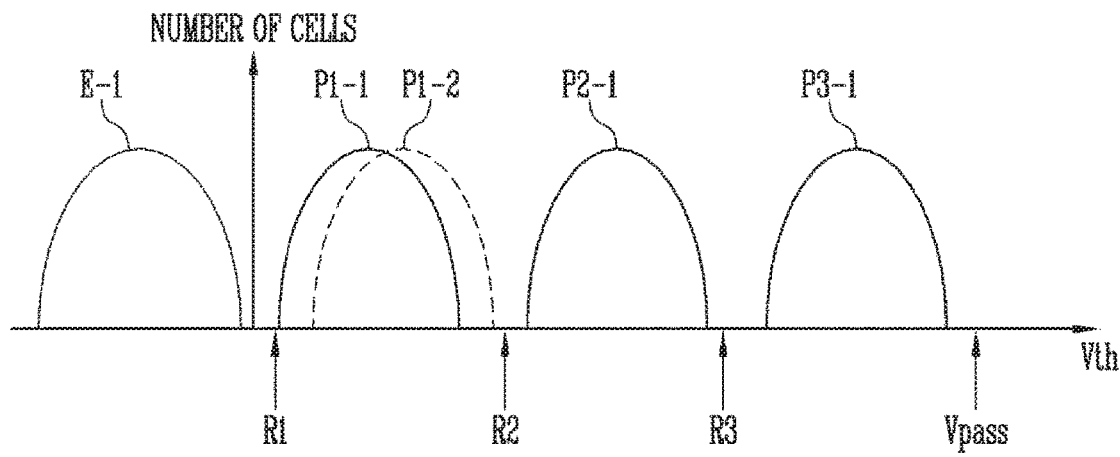
FIG. 12 is a diagram illustrating a change in threshold voltage distribution of memory cells as a threshold voltage increase operation of FIG. 11 is performed.

FIG. 12 is a diagram illustrating a change in threshold voltage distribution of memory cells as the threshold voltage increase operation of FIG. 11 is performed.

Referring to FIG. 12, the threshold voltages of the memory cells corresponding to the first program state P1 drift due to the threshold voltage increase operation to the first program state P1 of the first memory block at step S240. Specifically, the threshold voltage distribution of the memory cells in the first program state P1 drifts from a distribution P1-1 to a distribution P1-2.

As described with reference to FIGS. 11 and 12, in the semiconductor memory device 100 and the operating method thereof according to the present disclosure, the threshold voltage increase operation of step S240 on the first program state P1 of a corresponding memory block is performed whenever the block read count value reaches a specific threshold value. Thus, although the read operation is repeated, it is possible to ensure the read margin of the first read voltage R1 between the erase state E and the first program state P1. Accordingly, the operational reliability of the semiconductor memory device can be improved.

Figure 13:
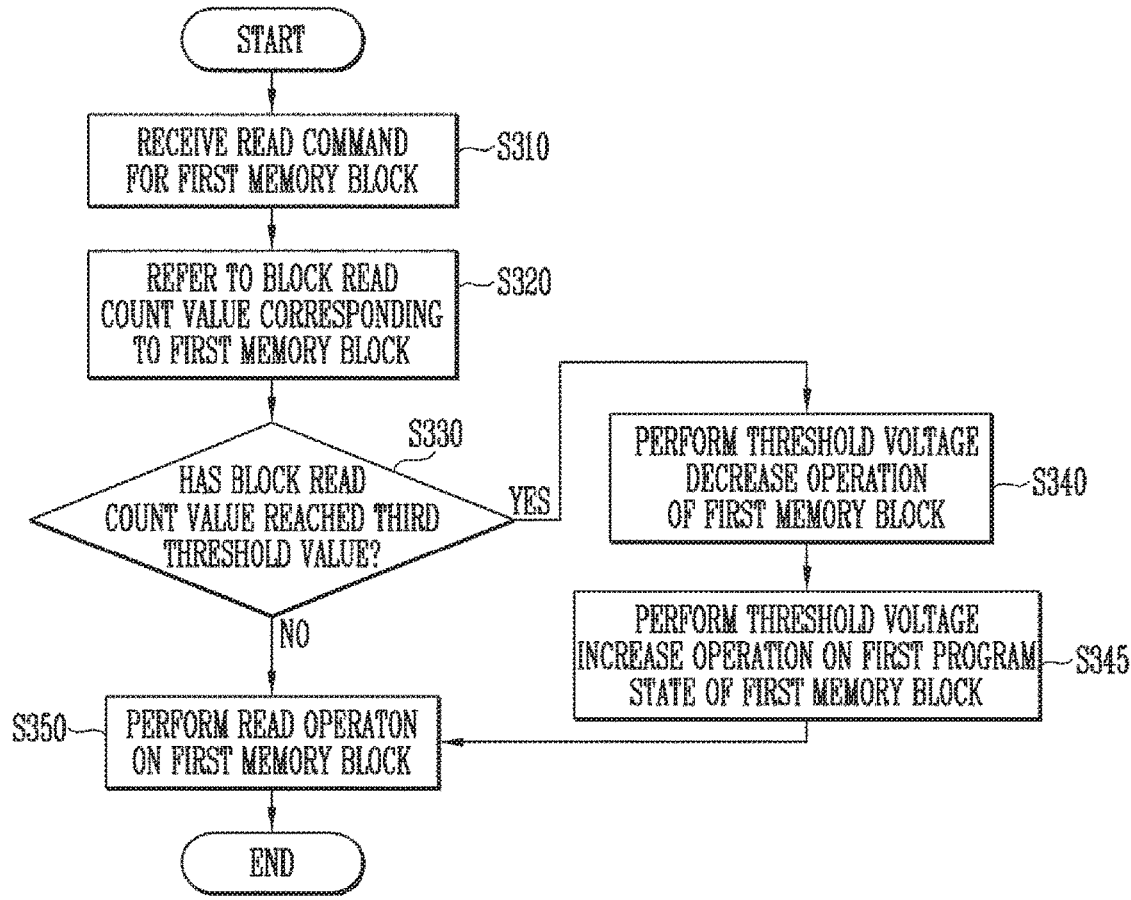
FIG. 13 is a flowchart describing an operating method of the semiconductor memory device according to still another embodiment of the present disclosure.

FIG. 13 is a flowchart describing an operating method of the semiconductor memory device 100 according to still another embodiment of the present disclosure.

Referring to FIG. 13, the semiconductor memory device 100 receives a read command from a first memory block at step S310.

Then, the semiconductor memory device 100 refers to a block read count value corresponding to the first memory block at step S320.

Subsequently, the semiconductor memory device 100 determines whether the referred block read count value has reached a third threshold value at step S330.

When the block read count value reaches the third threshold value, the semiconductor memory device 100 performs a threshold voltage decrease operation of the first memory block at step S340, performs a threshold voltage increase operation on the first program state P1 of the first memory block at step S345, and then performs a read operation on the first memory block at step S350.

When the block read count value does not reach the third threshold value, the semiconductor memory device 100 does not perform the threshold voltage decrease operation and the threshold voltage increase operation on the first program state P1 but performs the read operation on the first memory block at step S350.

The steps of FIG. 13 will now be described in detail with additional reference to FIG. 1.

In step S310, the semiconductor memory device 100 receives a read command for a first memory block from the controller. The received read command may be transferred to the control logic 140. The first memory block is any one of the memory blocks BLK1 to BLKz included in the memory cell array 110, and may be a memory block on which a program operation has already been performed.

In step S320, the control logic 140 refers to the block read count value corresponding to the first memory block on which a read operation is to be performed. To this end, the control logic 140 may transfer identification information of the first memory block to the block read counter 160. The block read counter 160 may transfer, to the control logic 140, the block read count value indicating how many times the read operation has been performed to the first memory block after the first memory block is programmed, based on the identification information received from the control logic 140.

In step S330, the control logic 140 determines whether the received block read count value has reached a third threshold value. The third threshold value may be determined and set based on operating parameters. The third threshold value may be different than, and used independently of, either of the above-described first and second threshold values. Also, the third threshold value may be equal to or different from the first threshold value or the second threshold value. The third threshold value may have a plurality of sub-values.

In step S340, the semiconductor memory device 100 performs the threshold voltage decrease operation of the first memory block. The threshold voltage decrease operation may be performed similarly to an erase operation of a memory block. As an example, the threshold voltage decrease operation may be performed by applying a first voltage having a positive value to the channel regions of all memory cells included in the first memory block, and applying a second voltage smaller than the first voltage to the word lines WL coupled to the first memory block. The first voltage and the second voltage may be selected as voltages that are not used to erase the first memory block but used to allow a threshold voltage to be slightly decreased.

Accordingly, some of the charges A1 and A2 in the charge storage layer CTN of FIG. 7 can escape to the channel layer. Thus, the amount of charges located in the charge storage layer CNT of the memory cells Cell1 and Cell3 adjacent to the memory cell Cell2 in the erase state E is decreased, and the "lateral charge drift" can be reduced even when the read operation is repeated later.

Also, in the step S345, the semiconductor memory device 100 performs a threshold voltage increase operation on the first program state P1 of the first memory block. The threshold voltage increase operation is performed to ensure the read margin of the first read voltage R1 by widening a distance between the threshold voltage distribution in the erase state E and the threshold voltage distribution in the first program state P1. The step S345 may be performed similarly to a program operation on the memory cells in the first program state P1. Step S345 is substantially identical to that of the step S240 of FIG. 11, and therefore, overlapping description will be omitted.

In the step S345 of FIG. 13, it is illustrated that the threshold voltage distribution of the memory cells corresponding to the first program state P1 is increased. Additionally, a threshold voltage distribution may be increased with respect to memory cells corresponding to the second program state P2 or memory cells corresponding to the third program state P3. In this case, the read margin of the second read voltage R2 or the third read voltage R3.

After the step S345 is performed, the semiconductor memory device 100 performs a read operation on the first memory block at step S350.

Although not shown in FIG. 13, if the read operation on the first memory block is completed, the block read count value of the first memory block, which is stored in the block read counter 160, may be increased by 1.

In the embodiment of FIG. 13, whenever the block read value reaches the third threshold value, the threshold voltage decrease operation to the first memory block and the threshold voltage increase operation to the first program state P1 of the first memory block are performed at steps S340 and S345, respectively.

As the step S340 is performed, the threshold voltage distributions of the memory cells having relatively high threshold voltages in the second and third program states P2 and P3 are decreased, which result in reduction of the "lateral charge drift" that charges drift to the memory cells in the erase state E. Thus, an increase in threshold voltage of the memory cells in the erase state E is suppressed even when the read operation is repeated, and the read margin of the first read voltage R1 can be ensured.

In addition, as the step S345 is performed, the threshold voltage distribution of the memory cells in the first program state P1 of the first memory block is increased, so that the read margin of the first read voltage R1 can be ensured. Accordingly, the operational reliability of the semiconductor memory device can be improved.

Figure 14:
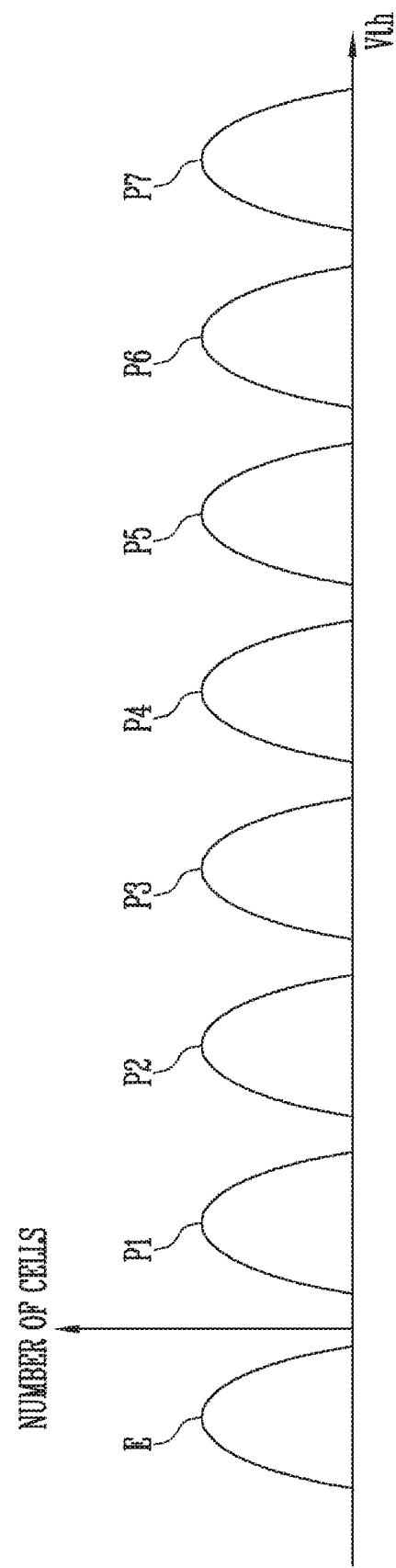
FIG. 14 is a diagram illustrating a threshold voltage distribution of triple level cells.

FIG. 14 is a diagram illustrating a threshold voltage distribution of triple level cells.

Referring to FIG. 14, the threshold voltage of each memory cell included in a memory block that is completely programmed is included in any one of an erase state E and first to seventh program states P1 to P7.

Based on the multi-level cells, the operating methods of the semiconductor memory device according to embodiments of the present disclosure have been described with reference to FIGS. 6 and 7. However, the present disclosure is not limited thereto. Rather, such methods may be applied to a semiconductor memory device including memory cells that are triple-level cells, quad-level cells, or more.

For example, in the embodiment shown in FIG. 9, as the threshold voltage decrease operation is performed in the step S140, the threshold voltage distributions of the memory cells having relatively high threshold voltages in the fifth to seventh program states P5 to P7 may be decreased. Accordingly, when memory cells having high threshold voltages are located adjacent to the memory cells in the erase state E, it is possible to reduce the "lateral charge drift."

In the embodiment shown in FIG. 11, as the threshold voltage increase operation on the first program state P1 of the first memory block is performed in the step S240, the threshold voltage distribution of the memory cells corresponding to the program state P1 is increased in FIG. 14.

In the step S240, the threshold voltage distribution of memory cells corresponding to at least one of the second to seventh program states P2 to P7 may be additionally increased. In this case, the read margin of at least one of the second to seventh read voltages can be improved.

Similarly, the steps S340 and S345 shown in FIG. 13 may also be applied to memory cells that are triple-level cells, quad-level cells, or more.

Figure 15:
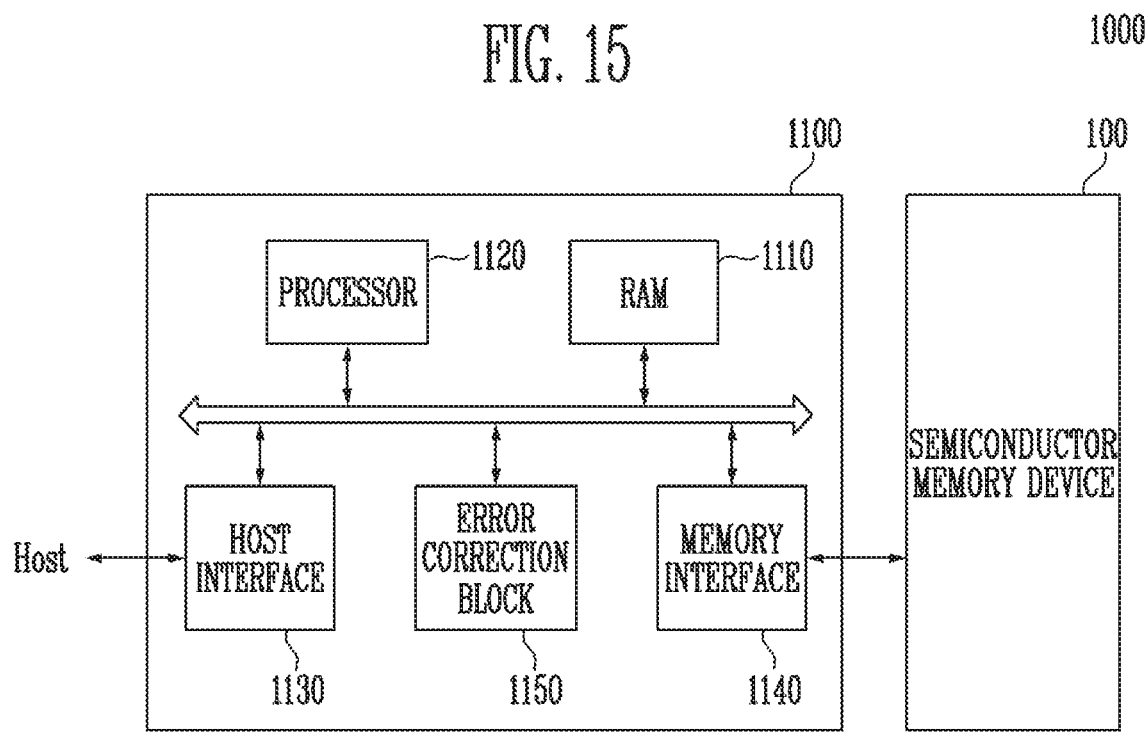
FIG. 15 is a block diagram illustrating a memory system including the semiconductor memory device of FIG. 1.

FIG. 15 is a block diagram illustrating a memory system including the semiconductor memory device of FIG. 1.

Referring to FIG. 15, the memory system 1000 may include a semiconductor memory device 100 and the controller 1100. The semiconductor memory device 100 may be the semiconductor memory device described with reference to FIG. 1. Thus, overlapping description is omitted below.

The controller 1100 is coupled to a host (Host) and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive firmware for controlling the semiconductor memory device 100.

The controller 1100 may include a random access memory (RAM) 1110, a processor 1120, a host interface 1130, a memory interface 1140, and an error correction block 1150. The RAM 1110 is used as at least one of an operation memory of the processor 1120, a cache memory between the semiconductor memory device 100 and the host, and a buffer memory between the semiconductor memory device 100 and the host. The processor 1120 controls overall operations of the controller 1100. Also, the controller 1100 may arbitrarily store program data provided from the host in a write operation.

The host interface 1130 may include a protocol for exchanging data between the host and the controller 1100. In an embodiment, the controller 1100 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processor 1120 may control the semiconductor memory device 100 to adjust a read voltage, based on an error detection result of the error correction block 1150, and to perform re-reading. In an embodiment, the error correction block 1150 may be provided as a component of the controller 1100.

The controller 1100 and the semiconductor memory device 100 may be integrated into a single semiconductor device. In an embodiment, the controller 1100 and the semiconductor memory device 100 may be so integrated into a memory card, such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into a single semiconductor device to constitute a semiconductor drive (solid state drive (SSD)), which includes a storage device configured to store data in a semiconductor memory. If the memory system 1000 is used as the semiconductor drive SSD, the operating speed of the host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment. Moreover, the memory system 1000 may be provided as one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 16:
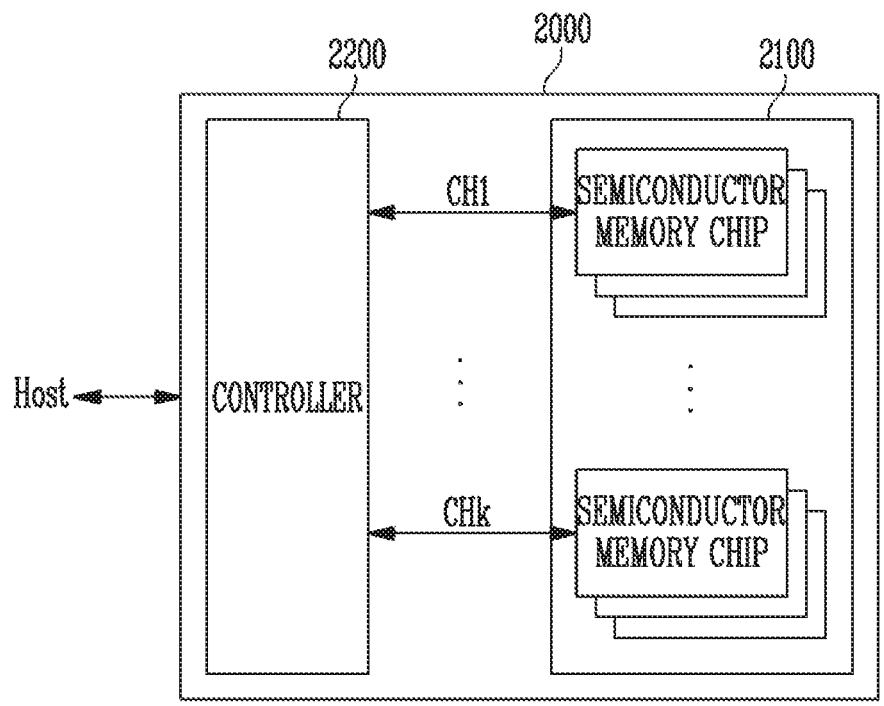
FIG. 16 is a block diagram illustrating an application example of the memory system of FIG. 15.

FIG. 16 is a block diagram illustrating an application example of the memory system of FIG. 15.

Referring to FIG. 16, the memory system 2000 may include a semiconductor memory device 2100 and a controller 2200. The semiconductor memory device 2100 may include a plurality of semiconductor memory chips. The plurality of semiconductor memory chips are divided into a plurality of groups.

FIG. 16 shows that the plurality of groups communicate with the controller 2200 through first to kth channels CH1 to CHk, respectively. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1100 described with reference to FIG. 15. The controller 2200 is configured to control the plurality of memory chips of the semiconductor memory device 2100 through the plurality of channels CH1 to CHk.

Figure 17:
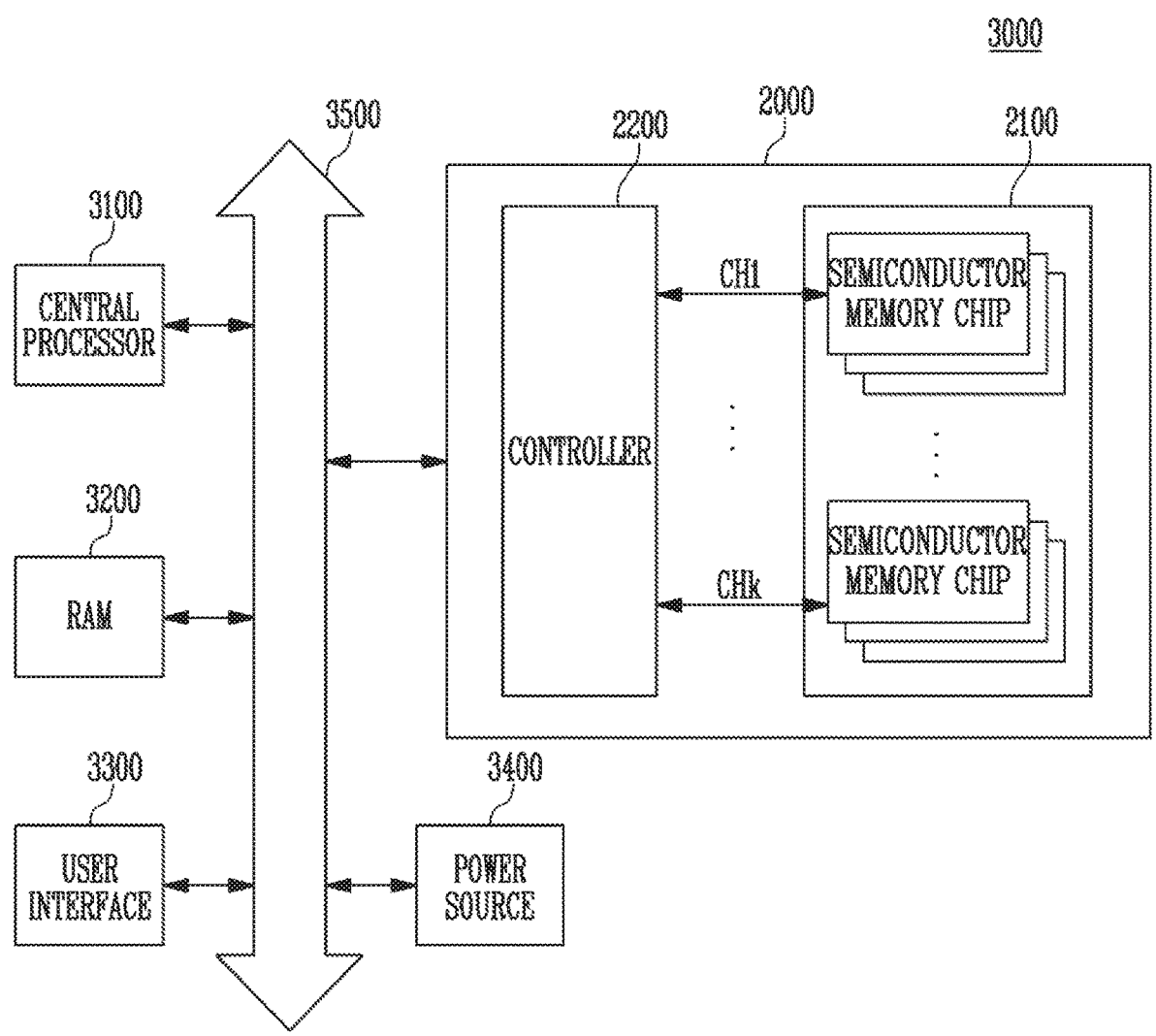
FIG. 17 is a block diagram illustrating an application example of a computing system including the memory system described with reference to FIG. 16.

FIG. 17 is a block diagram illustrating an application example of a computing system including the memory system described with reference to FIG. 16.

Referring to FIG. 17, the computing system 300 may include a central processor 3100, a RAM 3200, a user interface 3300, a power source 3400, a system bus 3500, and a memory system 2000.

The memory system 2000 is electrically coupled to the central processor 3100, the RAM 3200, the user interface 3300, and the power source 3400 through the system bus 3500. Data supplied through user interface 3300 or data processed by the central processor 3100 are stored in the memory system 2000.

FIG. 17 shows that the semiconductor memory device 2100 is coupled to the system bus 3500 through the controller 2200. However, the semiconductor memory device 2100 may be directly coupled to the system bus 3500. In this case, the function of the controller 2200 may be performed by the central processor 3100 and the RAM 3200.

FIG. 17 shows that the memory system 2000 described with reference to FIG. 16 is provided. However, the memory system 2000 may be replaced by the memory system 1000 described with reference to FIG. 15. In an embodiment, the computing system 3000 may be configured to include both the memory systems 1000 and 2000 described with reference to FIGS. 15 and 16.

According to the present disclosure, a semiconductor memory device having improved operational reliability is provided.

Further, according to the present disclosure, an operating method of a semiconductor memory device having improved reliability is provided.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a semiconductor memory device including a plurality of memory blocks, the method comprising:
   receiving a read command for a memory block among the plurality of memory blocks;
   referring to a block read count value corresponding to the memory block;
   determining whether the block read count value has reached a threshold value; and
   performing a read operation on the memory block based on the result of the determining operation,
   wherein the performing of the read operation on the memory block when it is determined that the block read count value reaches the threshold value, includes:
      performing a threshold voltage decrease operation of the memory block by decreasing a threshold voltage of at least one memory cell of the memory block; and
      performing the read operation on the memory block.

2. The method of claim 1, wherein the performing of the read operation on the memory block when it is determined that the block read count value does not reach the threshold value, includes:
   performing the read operation on the memory block.

3. The method of claim 2, wherein the performing of the threshold voltage decrease operation of the memory block includes:
   applying a first voltage having a positive value to a channel region of a cell string included in the memory block; and
   applying a second voltage smaller than the first voltage to word lines coupled to the memory block.

4. The method of claim 3, further comprising, after performing the read operation on the memory block, increasing the read count value of the memory block.

5. A semiconductor memory device comprising:
   a memory cell array including a plurality of memory blocks;
   a peripheral circuit configured to perform any one of a read operation, a write operation, and an erase operation on the memory cell array;
   a block read counter configured to store a block read count value of each of the plurality of memory blocks; and
   control logic configured to control operations of the peripheral circuit and the block read counter,
   wherein, when a read command for a memory block among the plurality of memory blocks is received, the control logic controls the peripheral circuit and the block read counter to perform a read operation on the memory block, based on a block read count value of the memory block, and
   wherein, when the block read count value of the memory block reaches a first threshold value, the control logic controls the peripheral circuit to perform a threshold voltage decrease operation of the memory block by decreasing a threshold voltage of at least one memory cell of the memory block and perform a read operation on the memory block.

6. The semiconductor memory device of claim 5, wherein, when the block read count value does not reach the first threshold value,
   the control logic controls the peripheral circuit to perform the read operation on the memory block.

7. The semiconductor memory device of claim 6, wherein the threshold voltage decrease operation is performed by applying a first voltage having a positive value to a channel region of a cell string included in the memory block, and applying a second voltage smaller than the first voltage to word lines coupled to the memory block.

8. The semiconductor memory device of claim 5, wherein, after the read operation on the memory block is performed, the control logic controls the block read counter to increase the block read count value.

* * * * *